US005543356A

United States Patent [19]
Murakami et al.

[11] Patent Number: 5,543,356
[45] Date of Patent: Aug. 6, 1996

[54] METHOD OF IMPURITY DOPING INTO SEMICONDUCTOR

[75] Inventors: Eiichi Murakami, Tokorozawa; Shin'icniro Kimura, Kunitachi, both of Japan

[73] Assignee: Hitachi, Ltd., Tokyo, Japan

[21] Appl. No.: 338,137

[22] Filed: Nov. 9, 1994

[30]   Foreign Application Priority Data

Nov. 10, 1993 [JP] Japan .................................. 5-281074
Apr. 20, 1994 [JP] Japan .................................. 6-081208

[51] Int. Cl.$^6$ .................................................. H01L 21/223
[52] U.S. Cl. ......................... 437/152; 437/165; 437/166; 437/173; 437/935; 437/950; 437/962; 437/984
[58] Field of Search ............................ 437/165, 166, 437/173, 950, 152, 935; 148/DIG. 40, DIG. 93, DIG. 144

[56]   References Cited

U.S. PATENT DOCUMENTS

| | | | |
|---|---|---|---|
| 3,364,085 | 1/1968 | Dahlberg | 437/161 |
| 4,263,066 | 4/1981 | Kolmann | 437/161 |
| 4,465,529 | 8/1984 | Arima et al. | 437/165 |
| 5,024,968 | 6/1991 | Engelsberg | 437/173 |
| 5,338,697 | 8/1994 | Aoki et al. | 437/161 |
| 5,352,330 | 10/1994 | Wallace | 437/935 |
| 5,366,926 | 11/1994 | Mei et al. | 437/173 |

FOREIGN PATENT DOCUMENTS 2-137313  5/1990  Japan .

OTHER PUBLICATIONS

S. Wolf "Silicon Processing For the VLSI Era, vol. 1", Lattice Press 1986, p. 265.
S. Wolf, "Silicon Processing For the VLSI Era, vol. 2", Lattice Press 1990, p. 372.
Tsubouchi et al, "Selective CVD on hydrogen–terminated Si surface", IEDM, Technical Digest, pp. 269–272, 1991.
Ono et al, "Sub 50nm Gate Length N–Mosfets with 10 nm Phosphorous Source. and Drain Junctions", IEDM, Technical Digest, pp. 119–122, 1993.

*Primary Examiner*—George Fourson
*Assistant Examiner*—Thomas G. Bilodeau
*Attorney, Agent, or Firm*—Antonelli, Terry, Stout & Kraus

[57]   ABSTRACT

A method of impurity doping into a semiconductor, which comprises irradiating energy rays such as excimer laser beam (or UV-rays) to a predetermined region of a hydrogen terminated silicon surface to remove hydrogen atom layers terminating the silicon surface thereby forming a patterned silicon surface region not terminated with hydrogen and selectively adsorbing impurities on the silicon surface region not terminated with hydrogen, to conduct impurity doping. When such an impurity doping method is adopted, junctions having shallow and abrupt distribution for use in a miniaturized MOSFET or the like can be attained with a lesser number of the steps. Since the impurity doping process can be constituted as a clean and all dry in-situ process without using photoresist at all, it can also provide advantageous effect in view of enhanced yield and shortened production period.

17 Claims, 15 Drawing Sheets

METHOD OF IMPURITY DOPING INTO SEMICONDUCTOR

BACKGROUND OF THE INVENTION

The present invention concerns a method of impurity doping into a semiconductor and an apparatus for use in such a method and, more in particular, it relates to a method of impurity doping into a semiconductor and an apparatus for use in such a method suitable to formation of a shallow junction with extremely small diffusion of an impurity distribution.

In silicon integrated circuits, high degree of integration and high operation speed have been attained so far by reducing the size of devices by the miniaturization of fabrication size. According to the scaling law, in order to form a refined MOSFET (Metal-Oxide-Semiconductor Field Effect Transistor), it is necessary for miniaturization in the direction of a plane, as well as reduction in the thickness of the gate oxide film or the direction of depth of a source/drain junction. Heretofore, ion implantation has been used for the formation of the source/drain function. However, for attaining a miniaturized device with a gate length of less than 0.2 µm that completely suppresses a short channel effect, an ultra-shallow junction at a ten nanometer order is required, which is a region difficult to be attained by ion implantation. Therefore, solid phase diffusion from a boron or phosphorus-doped oxide film (BSG, PSG) has been reestimated as a method of forming the shallow junction as described above. For instance, an example of trial production for n channel MOSFET having a gate length of 0.04 µm was reported in 1993 International Electron Devices Meeting, Technical Digest, pp. 119–122, and a source/drain junction at a junction depth of 10 nm, which was impossible to attain by ion implantation, has been attained.

However, in a case of selective doping for complementary MOSFET (CMOS) by the impurity doping method using the solid phase diffusion, it is necessary to previously fabricate a BSG or PSG film in a pattern as a impurity source used in the solid phase diffusion, or mask an undoped region previously with an oxide film before deposition of the BSG or PSG film. As a result, steps such as oxide film deposition and etching are added to the photoresist step to result in a problem that number of steps is further increased as compared with that in ion implantation.

Further, along with miniaturization of devices, an abrupt impurity distribution exceeding the limit of ion implantation is required also to a punch-through stopper formed for suppressing the short channel effect, in addition to the formation of the source/drain junction.

Furthermore, there is a problem of requiring a great number of steps at present, for example, in the well formation for CMOS, and channel doping for controlling various kinds of threshold voltages in memory LSI.

SUMMARY OF THE INVENTION

It is, accordingly, an object of the present invention to overcome the foregoing problems and provides a method of impurity doping into a semiconductor and an apparatus for use in such a method capable of attaining for example, a shallow junction having an abrupt impurity distribution enabling miniaturization of a device, punch-through stopper and well layer of CMOS with a lesser number of steps.

For attaining the foregoing object, a method of impurity doping into a semiconductor according to the present invention comprises irradiating energy rays, for example, excimer laser beams, UV-rays and electron beams to a required region on a hydrogen terminated silicon surface to remove hydrogen atom layers that terminate the silicon surface thereby forming a patterned silicon surface region not terminated with hydrogen and then selectively adsorbing impurities on the silicon surface region which is not terminated with hydrogen thereby conducting impurity doping. That is, according to the present invention, impurity doping can be conducted by selectively adsorbing impurities on the silicon surface not using a photoresist step but using hydrogen atom layers which can be formed and removed easily to and from the silicon surface directly as a mask for impurities.

The impurity doping may alternatively be conducted by forming a patterned first silicon surface region which is not terminated with hydrogen to the hydrogen terminated silicon surface, then exposing the same to an oxidative atmosphere to form an ultra-thin oxide film on the first silicon surface region, then removing residual hydrogen atom layers to form a second silicon surface region and selectively adsorbing impurities on the second silicon surface region.

In the method of impurity doping into the semiconductor, the impurity doping can be conducted preferably by selectively adsorbing impurities and then covering the surface with a silicon film or an oxide film in an identical processing apparatus.

Further, one of material selected from Sb, As, P, $SbH_3$, $AsH_3$ and $PH_3$ may be used as the impurities to be adsorbed selectively.

Further, another method of impurity doping into a semiconductor according to the present invention comprises forming a patterned first silicon surface region which is not terminated with hydrogen in the same manner on a hydrogen terminated silicon surface, selectively adsorbing impurities of a first conduction type to the first silicon surface region using hydrogen-terminating hydrogen atom layers as a mask to form an impurity adsorption layer of a first conduction type, then removing residual hydrogen atom layers to form a second silicon surface region and selectively adsorbing impurities of a second conduction type to the second silicon surface region by using the impurity adsorption layer of the first conduction type as a mask, thereby enabling to attain doping impurities of the first and second conduction types in a self-aligned fashion.

Furthermore, doping of impurities of the first and second conduction types can be conducted in a self-aligned fashion also by irradiating energy rays to a predetermined region on a silicon surface covered with impurity atoms of a first conduction type to remove impurity atoms of the first conduction type thereby exposing a patterned silicon surface region and selectively adsorbing impurities of a second conduction type on the silicon surface by region using a region covered with the impurity atoms of the first conduction type as a mask. The method of doping impurities of the first and second conduction types in a self-aligned fashion can provide n- and p-type source/drain junction for CMOS, punch-through stopper, impurity doping of a well layer with a lesser number of steps not using a photoresist step.

Furthermore, in the method of introducing impurities into the semiconductor, impurity doping can be conducted preferably by selectively adsorbing impurities of the second conduction type and then covering them with a silicon film or oxide film within an identical processing apparatus.

Further, the impurity of the first conduction type can be selected from Sb, As, P, $SbH_3$, $AsH_3$ and $PH_3$, while the impurity of the second conduction type can be selected from $HBO_2$, $B_2O_3$ and $B_2H_6$.

Further, doping of impurities at multi-level of concentration can be conducted in accordance with a method of impurity doping into a semiconductor according to the present invention, while comprising terminating a silicon surface with hydrogen atoms, placing the same in ultra high vacuum or inert gas, irradiating the silicon surface with energy rays by way of a reticle having at least three levels of transmission coefficients within a plane, desorbing hydrogen atoms in plural kinds of amount corresponding to the transmission coefficients and adsorbing impurities in plural kinds of amount by using the resultant residual hydrogen as a selection mask for impurity atoms or impurity atom-containing molecules.

The method of impurity doping into the semiconductor can be practiced preferably by using an apparatus for impurity doping into a semiconductor comprising a doping chamber for adsorbing impurity on a silicon surface, a pattern forming chamber capable of energy rays exposure in vacuum, a CVD chamber capable of depositing a silicon or oxide film, and a load-lock chamber for charging/discharge silicon substrate, in which each of them is connected and arranged around a transfer chamber each by way of a gate valve for the transfer of silicon substrates.

The hydrogen terminating technology itself has been known so far including an example of applying to formation of a thin oxide film or nitride film pattern (Japanese Patent Laid-Open No. Hei 2-137313), and an example used for selective growing of aluminum wirings (1991 International Electron Devices Meeting, Technical Digest, pp. 269–272) or the like. However, even if it is intended for impurity doping into a semiconductor by merely combining the thin oxide film or nitride film in the former, or selectively grown pattern of aluminum in the latter formed by existent hydrogen terminating technology with ion implantation or solid phase diffusion as the existent impurity doping technology, since the thickness of the film formed by the hydrogen terminating technology is at an order as thin as several atoms, it can not be used at all as a mask for impurity doping required for forming an ultra-shallow junction having an abrupt profile along with miniaturization of devices.

On the contrary, the method of impurity doping into the semiconductor according to the present invention has been achieved based on a novel finding that a portion of the silicon surface terminated with hydrogen has a property not to adsorb impurity atoms (and/or molecules) upon adsorption of impurity atoms (and/or molecules) as described later, and it provides a novel doping method having a controllability at an atom layer level by using hydrogen terminating technique and selective adsorption technique of impurity atoms.

As has been described above according to the method of impurity doping into the semiconductor and the apparatus for use in such a method of the present invention, doping formed with a controllability at an atom layer level can be realized selectively and with a lesser number of steps as compared with existent ion implantation or solid phase diffusion, and it is particularly suitable to a case of attaining a miniaturized MOSFET requiring a ultra-shallow junction having an abrupt profile of less than 50 nm.

BRIEF DESCRIPTION OF THE DRAWINGS

These and other objects of the present invention become apparent by the following detailed descriptions and appended claims with reference to the accompanying drawings. In the drawings appended herewith, identical reference numerals show identical or similar portions.

FIGS. 3A and 3B are views explaining the principle of impurity doping used in a method of impurity doping into a semiconductor according to the present invention, in which FIG. 3A is an Auger electron spectral characteristic chart in a case of using a hydrogen mask, FIG. 3B is an Auger electron spectral characteristic chart in a case of using a Sb mask;

DESCRIPTION OF THE PREFERRED EMBODIMENTS

The present invention will be described by way of its preferred embodiments more in details with reference to the appended drawings.

Preceding to the explanation for specific embodiments, the principle for impurity doping using a hydrogen terminated silicon surface as a mask, doping of impurity of second conduction type using impurity atoms of a first conduction type as a mask and doping of impurities using an ultra-thin oxide film as a mask will be explained.

Figure 3A:
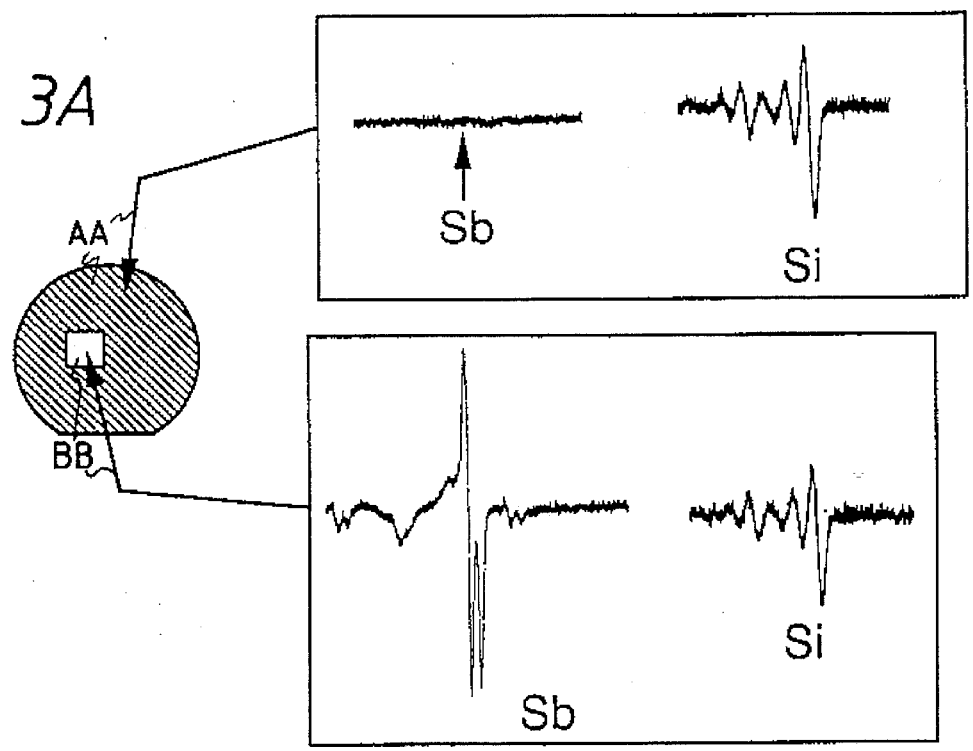

The present inventors have newly found that the hydrogen terminated silicon surface has a property not to adsorb impurities such as atoms of Sb, As and P and molecules of $SbH_3$, $AsH_3$ and $PH_3$. FIG. 3A is Auger electron spectral characteristic charts showing the result of experiment in a case of supplying, for example, Sb atoms by evaporating them from a Knudsen cell to the surface of a silicon wafer on which are formed a portion AA (hatched area) of a hydrogen terminated surface having a hydrogen mask and a rectangular portion BB with no hydrogen mask. As can be seen from each of Auger electron spectrum for the portion AA and portion BB shown in FIG. 3A, silicon (Si) atoms were detected but Sb atoms were not detected in the portion AA having the hydrogen mask, while both of the Si atoms and the Sb atoms were detected in the portion BB having no hydrogen mask. That is, the Sb atoms are adsorbed only at the portion of the silicon surface with no hydrogen mask.

Figure 3B:
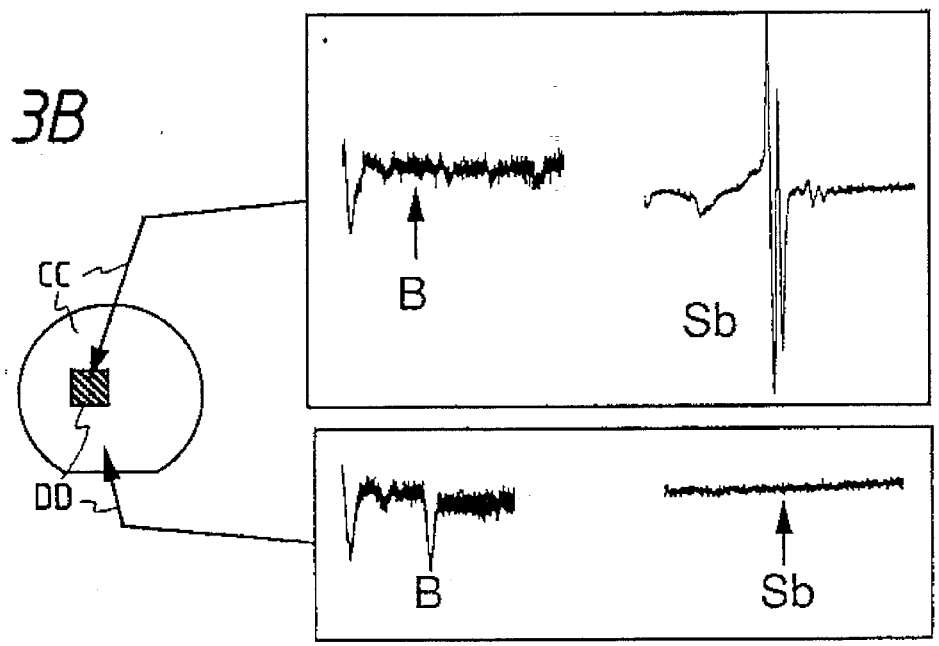

In addition, an Si surface covered with a single atom layer such as of Sb, As and P has a property not to adsorb molecules of $HBO_2$, $B_2O_3$ and $B_2H_6$ which are impurity source of boron (B) atoms. This is explained with reference to FIG. 3B. FIG. 3B is an Auger electron spectral characteristic chart illustrating the result of experiment in a case of supplying, for example, $HBO_2$ molecules by evaporating them from a Knudsen cell on the surface of a silicon wafer on which are formed a portion CC (hatched area) having an Sb mask formed by covering the silicon wafer, for example, with Sb atoms in a rectangular shape and a region DD not covered with the Sb atoms. As can be seen from each of the Auger electron spectrum for each of the portion CC and the portion DD shown in FIG. 3B, the Sb atoms were detected but B atoms were not detected at the portion CC having the Sb mask, whereas the B atoms were detected at the portion DD having no Sb mask. That is, B atoms are deposited only to the portion of the silicon surface having no Sb mask. By utilizing this, the B atoms can be adsorbed in a self-aligned fashion to the Sb-free region. Although not shown in FIG. 3B, the Auger electron spectrum for the Si atoms were of course detected in the portion CC and the portion DD.

Figure 4A:
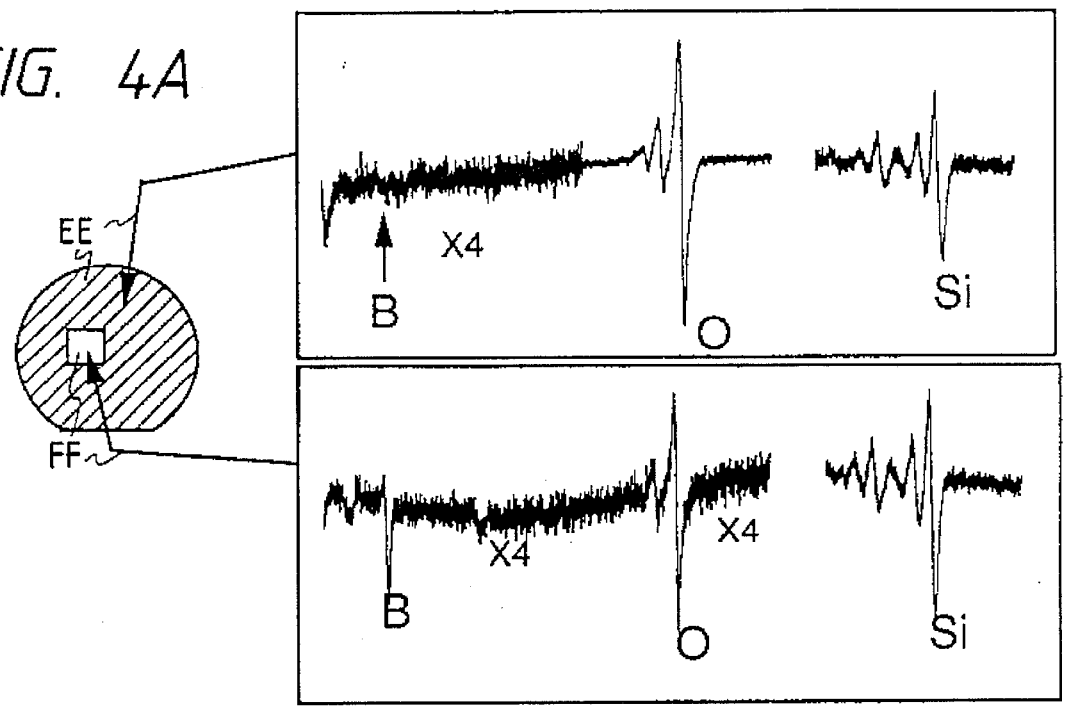
FIGS. 4A and 4B are views explaining the principle of impurity doping used in a method of impurity doping into a semiconductor according to the present invention, which are Auger electron spectral characteristic charts illustrating doping of B atoms (FIG. 4A) and of Sb atoms (FIG. 4B), respectively, using a ultra-thin oxide film mask.
Figure 4B:
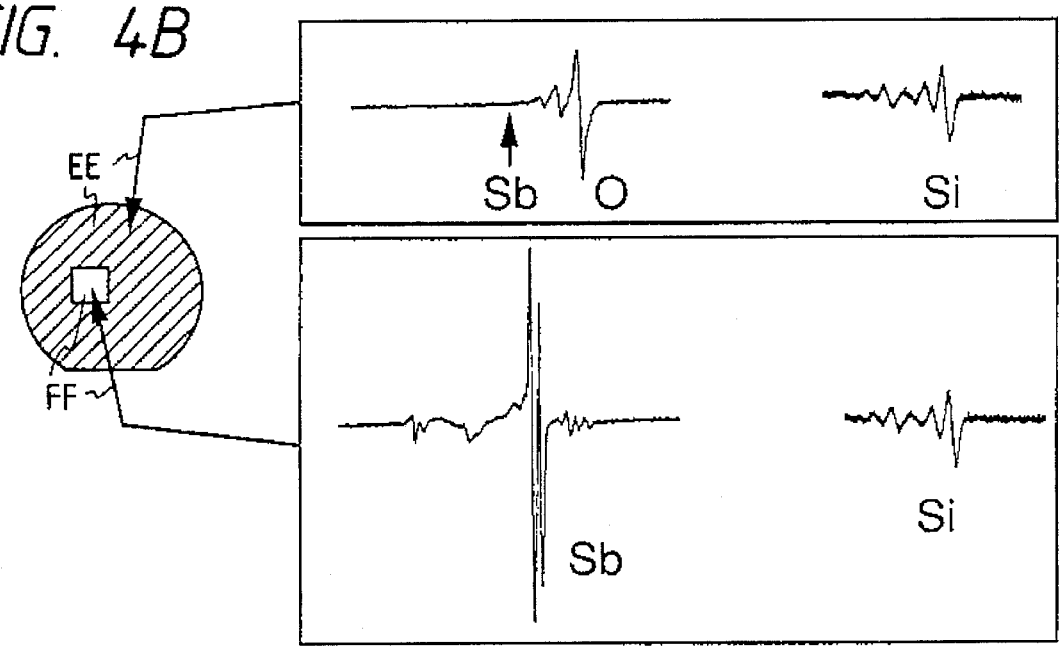
Figure 5A:
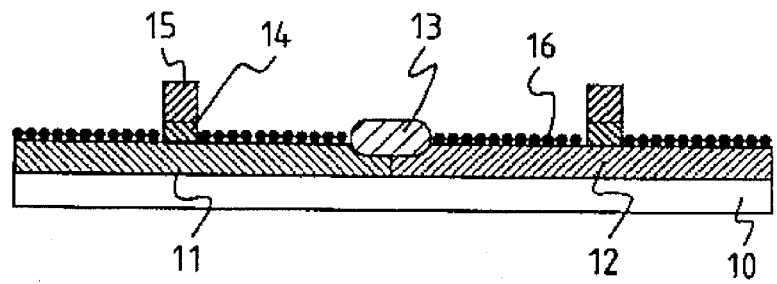
FIGS. 5A to 5C are cross sectional structural views schematically illustrating successively principal processing steps in a second embodiment of a method of impurity doping into a semiconductor according to the present invention.
Figure 5B:
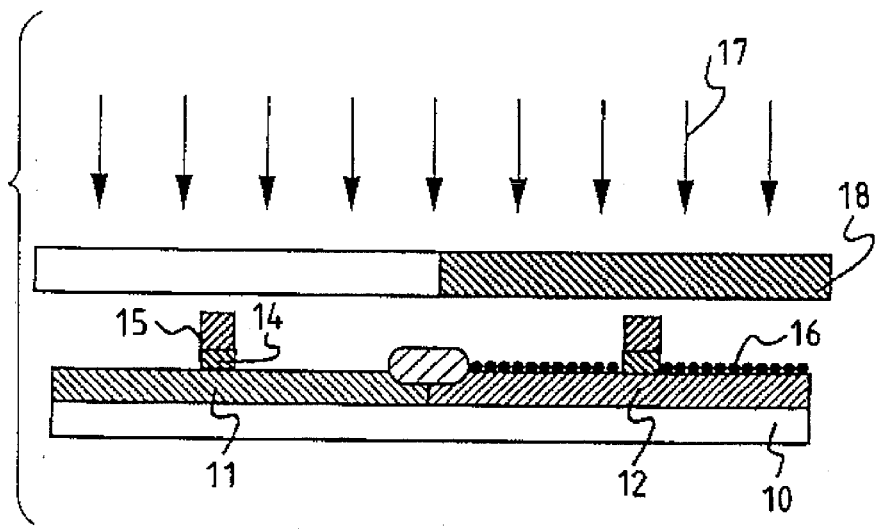
Figure 5C:
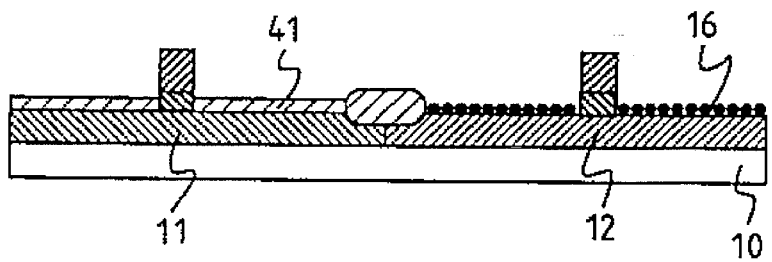

Further, an ultra-thin oxide film having a thickness of less than 0.5 nm also shows a similar phenomenon not adsorbing the impurities, which will be explained with reference to FIG. 4A and FIG. 4B. FIG. 4A and FIG. 4B are Auger electron spectral characteristic charts illustrating the result of experiment of supplying impurity to the surface of a silicon wafer on which are formed an ultra-thin oxide film mask portion EE (hatched area) formed by covering the surface with an ultra-thin oxide film and a portion FF with no ultra-thin oxide film mask being not covered with the ultra-thin oxide film. FIG. 4A shows Auger electron spectrum showing an example of supplying $HBO_2$ as the impurity and FIG. 4B shows Auger electron spectrum showing an example of supplying Sb as the impurity. As can be seen from each of the Auger electron spectrum for the portion EE and the portion FF shown in FIG. 4A, both of oxygen (O) atoms and Si atoms were detected at the portion EE having an ultra-thin oxide film mask, but B atoms were not detected even when the sensitivity was increased by four times, whereas the B atoms were detected at the portion FF having no ultra-thin oxide film mask. Further, also for FIG. 4B, the O atoms and the Si atoms were detected at the portion EE having the ultra-thin oxide film mask but the Sb atoms were not detected, whereas the Sb atoms were detected at the FF portion with no ultra-thin oxide film mask. That is, adsorption of the B atoms and the Sb atoms were not observed on the ultra-thin oxide film but the B atoms and the Sb atoms were adsorbed only on the portion having no ultra-thin oxide film. Accordingly, the Si surface having a hydrogen atom mask formed thereon is exposed to an oxygen atmosphere to form an ultra-thin oxide film only at a region having no hydrogen atoms and this can be used as a mask for impurity adsorption.

EXAMPLE 1

Descriptions will be made to a first embodiment of a method of impurity doping into a semiconductor according to the present invention with reference to FIGS. 1A to 2D. FIGS. 1A to 2D are cross sectional structural views schematically illustrating principal processing steps successively in a case of applying a method of impurity doping into a semiconductor according to the present invention to the formation of a shallow junction source/drain in Si-CMOS. Descriptions will be made in the order of steps.

Figure 1A:
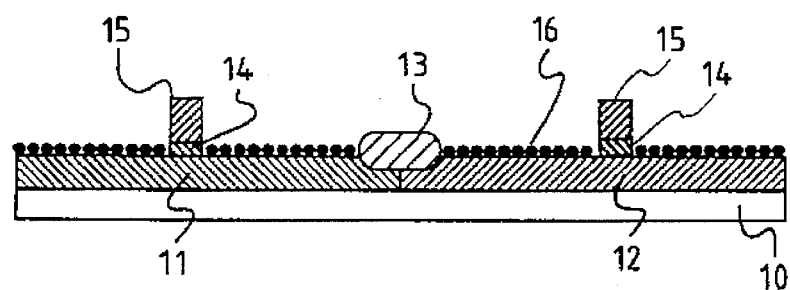
FIGS. 1A and 1B are cross sectional structural views schematically illustrating successively principal processing steps in a first embodiment of a method of impurity doping into a semiconductor according to the present invention.

In FIG. 1A, reference numeral 10 represents an Si substrate. After forming p-well layer 11 and n-well layer 12 on Si substrate 10, isolation oxide 13 is formed by LOCOS (Local oxidation of silicon) oxidation. Then, after forming gate oxide film 14 and silicide gate electrode 15, Si substrate 10 is chemically cleaned with, for example, a mixed solution of aqueous ammonia and hydrogen peroxide. Further, the surface of Si substrate 10 is terminated with hydrogen atoms 16 by removal of spontaneous oxide films in an aqueous solution of hydrofluoric acid.

Figure 1B:
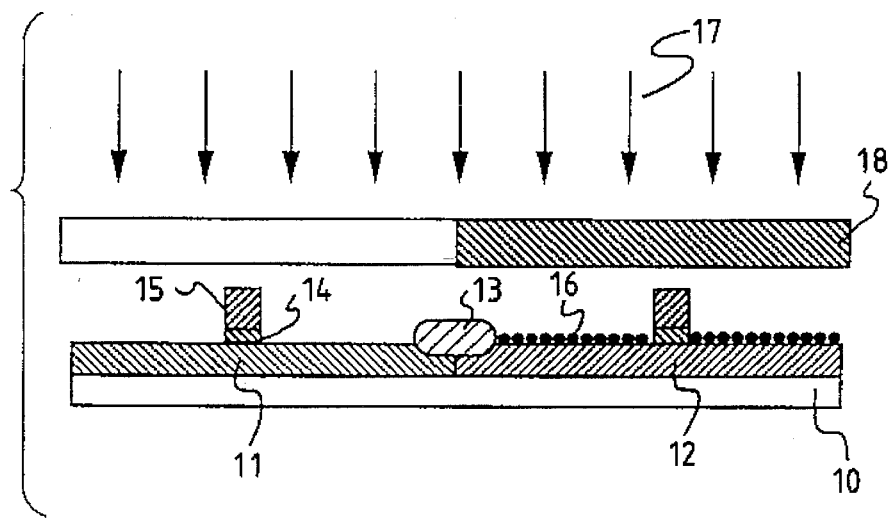

Then, as shown in FIG. 1B, KrF excimer laser beams 17 are irradiated through quartz reticle 18. KrF excimer laser beams 17 are irradiated in ultra-high vacuum or high purity nitrogen so as not to oxidize the Si surface. In this case, hydrogen atoms 16 are removed by desorption from a portion irradiated with KrF excimer laser beams 17 transmitting through a transparent portion of reticle 18 but hydrogen atoms 16 remain on the surface opposing to a light shield portion of reticle 18 shown by hatched lines since KrF excimer laser beams 17 are not irradiated there.

Figure 2A:
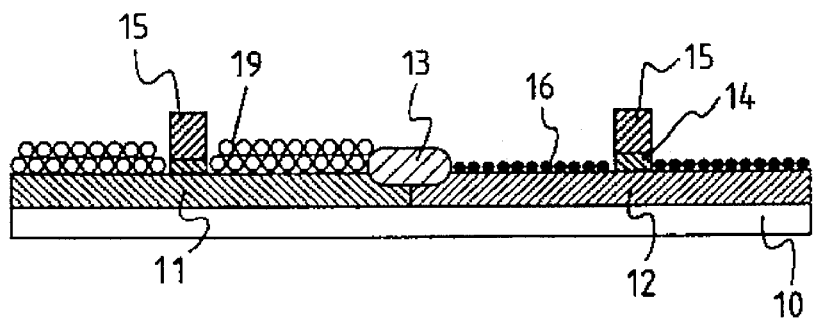
FIGS. 2A to 2D are cross sectional structural views schematically illustrating successively processing steps subsequent to FIG. 1B.

Then, as shown in FIG. 2A, Sb atoms 19 were selectively adsorbed by several atoms layers on the Si surface. As described later, Si substrate 10 irradiated with KrF excimer laser beams 17 is introduced as it is with no exposure to atmosphere into a ultra-high vacuum chamber, to which a predetermined amount of Sb atoms 19 are adsorbed from a Knudsen cell while controlling the evaporation amount by the on-off of a shutter. In the drawings, for the sake of easy understanding, Sb atoms (or $Sb_4$ molecules) 19 are represented by blank circles and as two atom layers. By thoroughly covering 99% of the Si surface with the Sb atoms, four or more layers are actually necessary. The temperature of Si substrate 10 (hereinafter referred to as a substrate temperature) is not more than 500° C. at which hydrogen atoms 16 are not desorbed. Since adsorption of the Sb atoms is observed also on the hydrogen terminated Si to some extent at a room temperature, the Sb adsorption amount on hydrogen terminated Si is reduced to less than 1/500 of the adsorbed amount on the cleaned Si surface by setting the substrate temperature at 350° C. Accordingly, the substrate temperature is preferably within a range from 350° to 500° C.

Figure 2B:
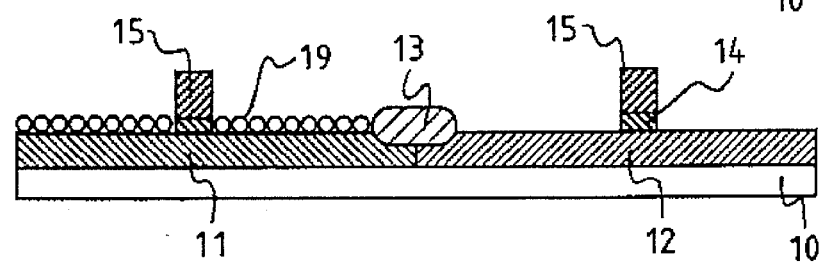

Successively, as shown in FIG. 2B, the substrate temperature is raised to 600°–700° C. to leave Sb atoms 19 only by one atom layer bonded to the Si surface. In this step, the hydrogen mask constituted with residual hydrogen atoms 16 is also desorbed.

Figure 2C:
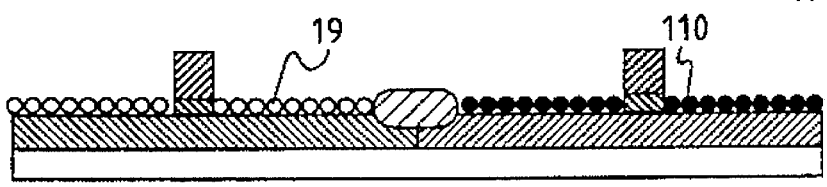

Then, $HBO_2$ molecules 110 are evaporated from a Knudsen cell and adsorbed on the surface as shown in FIG. 2C. For easy understanding, $HBO_2$ molecules (or decomposition product thereof) 110 are represented by solid circles which is slightly greater than hydrogen atoms 16 in the drawing. Adsorption of $HBO_2$ molecules 110 results selectively only to a region with no Sb atoms 19 at a substrate temperature of 600° C. Namely, a pattern of the $HBO_2$ molecule layer can be formed in a self-aligned fashion to the pattern of the Sb atom layer.

Figure 2D:
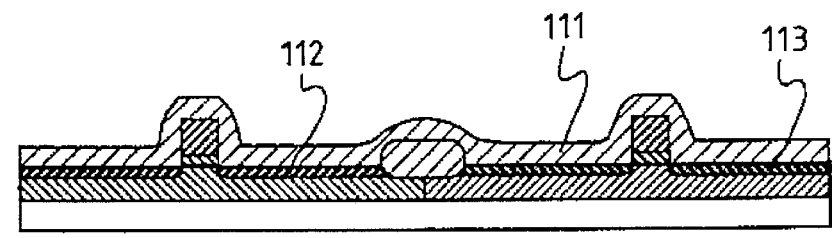

Finally, as shown in FIG. 2D, CVD oxide film 111 is deposited at a substrate temperature not more than 600° C., and drive-in diffusion is applied in nitrogen, for example, at 950° C. for about 10 sec to form n-channel FET source/drain 112 and p-channel FET source/drain 113 simultaneously.

Figure 15:
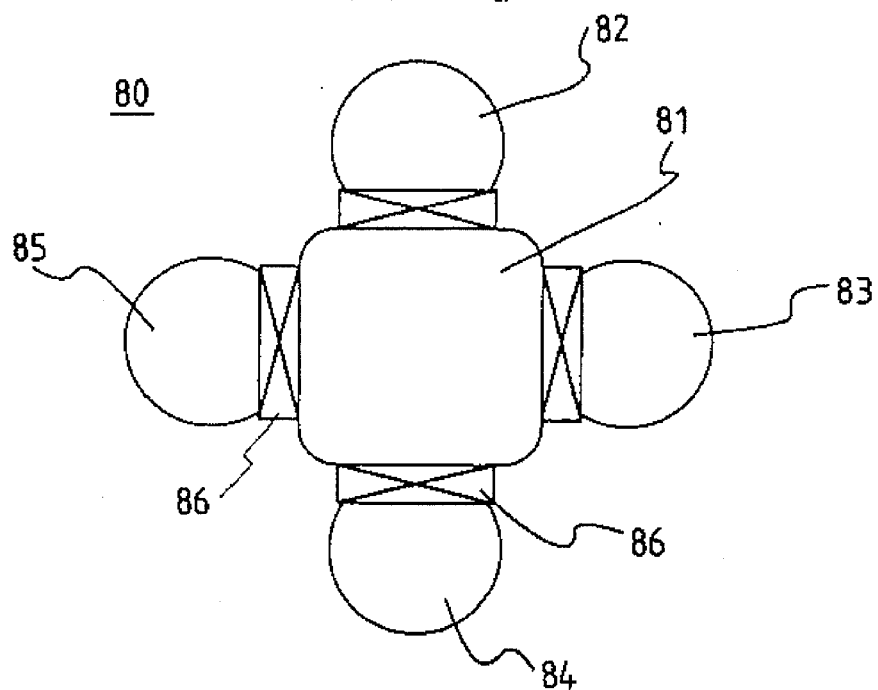
FIG. 15 is a schematic view illustrating a way of connection in an apparatus for impurity doping into a semiconductor according to the present invention.

FIG. 15 shows a cluster chamber used for applying impurity doping. Cluster chamber 80 comprises pattern forming chamber 82 capable of vacuum exposure by irradiating energy rays such as excimer laser beams, UV rays and electron rays in a pattern, doping chamber 83 for impurity adsorption that adsorbs impurities on the Si surface, CVD chamber 84 for deposition of Si film, oxide film or the like and load-lock chamber 85 for charging/discharging Si substrates in which they are disposed around a transfer chamber 81 for the transfer of Si substrate as a center and each of them is connected by way of gate valve 86 to transfer chamber 81. In this embodiment, particularly, transfer chamber 81, pattern forming chamber 82, and doping chamber 83 are constituted each as a ultra-high vacuum chamber at a base pressure not more than $1/10^7$ Pa. With such constitution of the apparatus, since Si substrate 10 can be transferred with no exposure to atmosphere to succeeding steps respectively, spontaneous oxidation on the Si surface can be prevented.

In this embodiment, the number of source/drain forming steps is decreased to one-half as compared with existent impurity doping method using the photoresist step, ion implantation step or the like. Since shallow pn junction with a junction depth of 20 nm and a sheet resistance of 5KΩ/☐ can be formed, a high speed operation of CMOS with gate length of 0.15 μm can be attained. Further, since the impurity doping process is a clean and all dry in-situ process not using photoresist at all, it can provide an advantageous effect for the improvement of the yield and shortening of the production period.

Further, since the hydrogen mask is also free from a problem of contamination to the Si surface, it is more suitable to an ultra-shallow junction forming requiring a fine pattern as compared with existent ion implantation or solid phase diffusion using the photoresist step.

Figure 16:
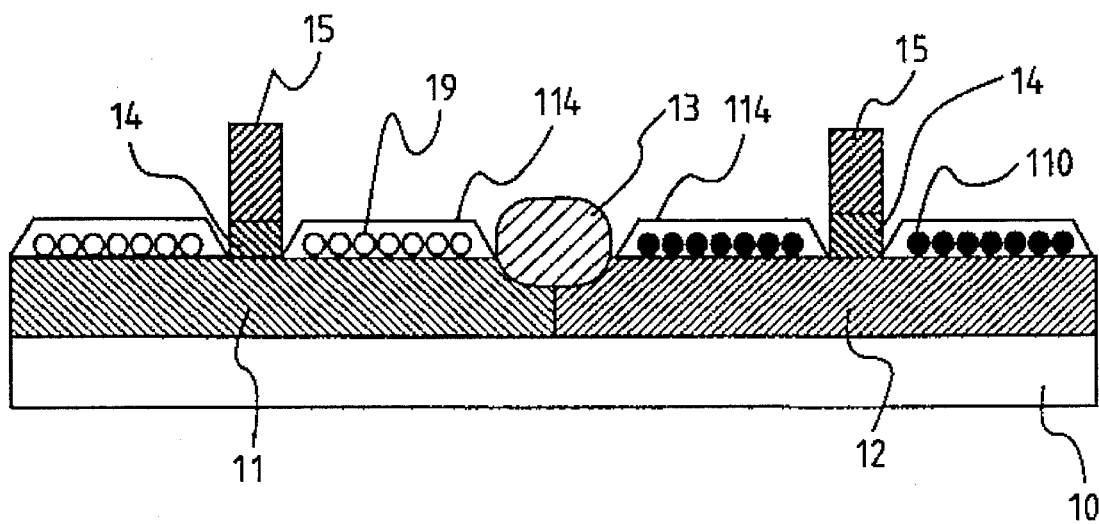
FIG. 16 is a cross sectional structural view illustrating another embodiment of a method of impurity doping into a semiconductor according to the present invention, which is a cross sectional structural view schematically illustrating processing steps subsequent to the steps shown in FIG. 2C.

Further, in a fine CMOS with a gate of less than 0.1 μm, a junction depth not more than 10 nm is required. In this case, for attaining the sheet resistance not more than 5KΩ/☐, drive-in diffusion restricted in view of the doping amount due the limit for the solid solubility of impurities upon diffusion is not preferred. In this case, as shown in FIG. 16, single crystal Si film 114 may be formed, for example, to about 5–50 nm by using selective epitaxy on Sb atoms 19 and $HBO_2$ molecules 110 as adsorbed impurities. In particular, when selective Si epitaxy is conducted at a substrate temperature of about 600° C. using a ultra-high vacuum (UHV) process, doping at a high density and having an abrupt distribution like that a δ function is possible. It is of course necessary in this case that CVD chamber 84 shown in FIG. 15 be constituted as an UHV-CVD chamber with a base pressure not more than $1/10^7$ Pa. Since impurities 19, 110 adsorbed to the surface by selective epitaxy intrude into lattices of single crystals Si, doping is not restricted by the limit of solid solution of the impurities upon diffusion. Selective growing of the single crystal Si exceeding 50 nm is not preferred since lattice defects or strains are formed near gate electrodes 15. FIG. 16 is a cross sectional structural view for the next step explained with reference to FIG. 2C.

Alternatively, Si selective epitaxy may be replaced with a process of entirely depositing amorphous Si at 500° C., heating at 600° C., thereby selectively crystallizing amorphous Si only on single crystals, then removing only the amorphous Si by etching with hot phosphoric acid and thereby forming an Si single crystal layer on the adsorbed impurities 19, 110.

In accordance with the procedures described above, an ultra-shallow pn junction with a junction depth of 10 nm and the sheet resistance of 2KΩ/☐ can be formed, so that a high speed circuit operation of 10 ps of gate delay time can be attained in CMOS with gate length of 0.05 μm.

Although descriptions have been made in this embodiment to a case of using Sb atoms 19 and $HBO_2$ molecule 110 as the impurity source, As atoms, P atoms or gaseous molecules of $SbH_3$, $AsH_3$, $PH_3$, $B_2O_3$ or $B_2H_6$ can also be used. In addition, while KrF excimer laser beams 17 were used as an energy ray source for the formation of the hydrogen atom mask, UV rays, X-rays or electron rays may also be used. Further, selective adsorption of the impurities using the hydrogen atom mask may be replaced with the method of entirely adsorbing impurities such as Sb atoms, As atoms and P atoms, then partially desorbing the impurity by irradiation of the energy rays described above to fabricate into a pattern-like configuration and then using the same as a mask for $HBO_2$, $B_2O_3$ and $B_2H_6$.

EXAMPLE 2

Descriptions will then be made to a second embodiment for a method of doping impurity into a semiconductor according to the present invention with reference to FIGS. 5A to 6C. FIGS. 5A to 6C are cross sectional structural views schematically showing principal processing steps successively to a case of applying the invention to the formation of an ultra-shallow junction source/drain in Si-CMOS. In this embodiment, each of the cross sectional structures from FIG. 5A to FIG. 5B can be obtained by the same processing as those in the processing steps explained for FIG. 1A to FIG. 1B of Example 1. Accordingly, description will be made for FIG. 5C to FIG. 6C in the order of the steps.

After forming a hydrogen mask by terminating an Si surface with hydrogen atoms 16 on n-well layer 12 by the same processing as in Example 1, it is heated to a temperature not exceeding 350° C. in an oxidative gas atmosphere, to form ultra-thin oxide film 41 of about 0.5 nm thickness only at the Si surface on p-well layer 11 with no hydrogen atoms 16.

Figure 6A:
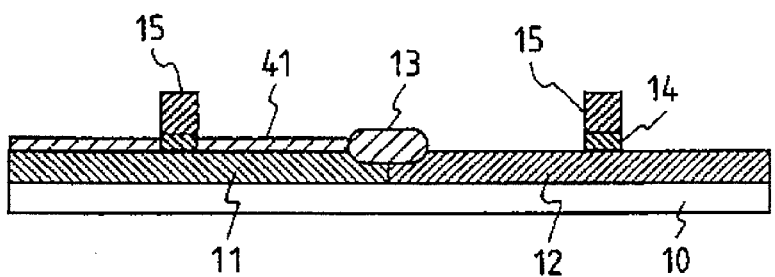
FIGS. 6A to 6C are cross sectional structural views schematically illustrating processing steps subsequent to FIG. 5C sequentially.

Then as shown in FIG. 6A, the hydrogen mask is removed by heating to about 600°–700° C. in vacuum. Thus, p-well layer 11 is masked with ultra-thin oxide film 41 and the Si surface is exposed on n-well layer 12.

Figure 6B:
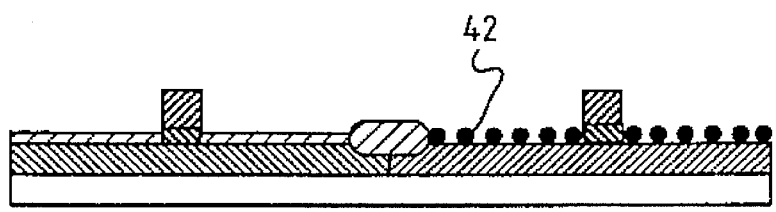

Successively, as shown in FIG. 6B, $B_2H_6$ molecules 42 are selectively adsorbed to a portion with no oxide film. For the sake of easy understanding, $B_2H_6$ molecules (or decomposition products thereof) 42 are represented by solid circles slightly greater than hydrogen atoms 16 in the drawing.

Figure 6C:
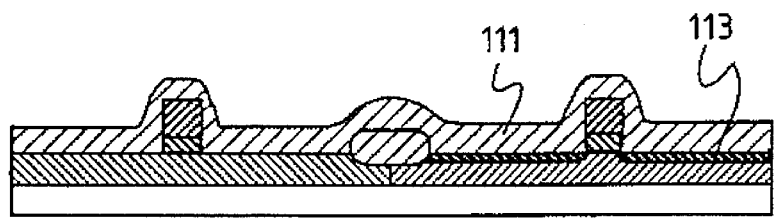

Finally, as shown in FIG. 6C, CVD oxide film 111 is deposited at a substrate temperature not more than 600° C., and drive-in diffusion is applied in nitrogen to form drain/source region 113 for p-channel FET. Since B atoms are not desorbed even by heating, the drive-in diffusion may be conducted with no deposition of the CVD oxide film.

This embodiment has an advantage, particularly, in that it requires no ultra-high vacuum chamber as compared with Example 1. Accordingly, the constitution of the apparatus used for the method of doping impurity in this embodiment may be identical with cluster chamber 80 shown in FIG. 15, but there is no requirement to constitute each of transfer chamber 81, pattern forming chamber 82 and doping chamber as an ultra-high vacuum chamber as in Example 1. By using the method of impurity doping into the semiconductor in this embodiment, since a shallow $p^+$ n junction with a junction depth of 30 nm and a sheet resistance of 5 K$\Omega$/□ can be formed, high speed operation of p-MOSFET with a gate length of 0.2 μm can be attained. Further, the number of source/drain forming steps is decreased as compared with the existent method by applying the photoresist step and the ion implantation step. It will be apparent that the method of impurity doping into the semiconductor of this embodiment is applicable to the formation of n-MOSFET by replacing the impurity, for example, with Sb atoms, P atoms and As atoms.

EXAMPLE 3

Descriptions will be made to the third embodiment for the method of impurity doping into the semiconductor according to the present invention. FIG. 7A to FIG. 8D are cross sectional structural views schematically showing principal processing steps successively in a case of applying the invention to the formation of a punch-through stopper in Si-CMOS. In this embodiment, the cross sectional structure of FIG. 7A can be obtained by applying the same processing as those in the processing step explained for FIG. 1A. Descriptions will be made in the order of steps with reference to FIG. 7B to FIG. 8D. Cluster chamber 80 shown in FIG. 15 is used as the impurity doping apparatus.

Figure 7A:
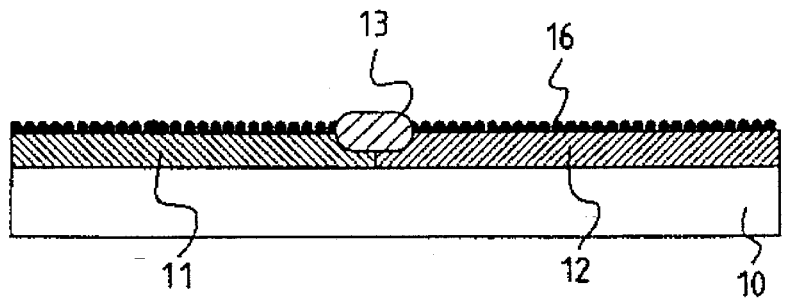
FIGS. 7A to 7C are cross sectional structural views schematically illustrating sequentially principal processing steps in a third embodiment of a method of impurity doping into a semiconductor according to the present invention.
Figure 7B:
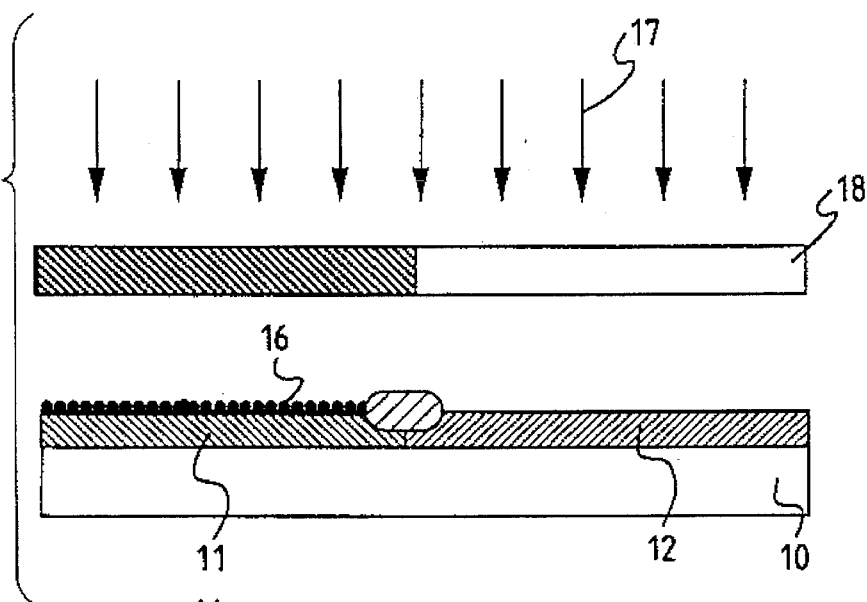

As shown in FIG. 7B, KrF excimer laser beams 17 are irradiated through quartz reticle 18 to substrate 10 in which the Si surface is terminated with hydrogen in pattern forming chamber 82. In this step, hydrogen atoms 16 are desorbed from a portion irradiated with KrF excimer laser beams 17 that transmit through a transparent portion of reticle 18 but hydrogen atoms 16 remain at the surface opposing to the light shield portion of reticle 18 shown by hatched lines since KrF excimer laser beams 17 are not irradiated there. FIG. 7B is different from FIG. 1B only with respect to the positions for the transparent portion and the light-shield portion of reticle 18. Accordingly, hydrogen atoms 16 remain on p-well layer 11, while hydrogen atoms 16 are desorbed to expose the Si surface on n-well layer 12.

Figure 7C:
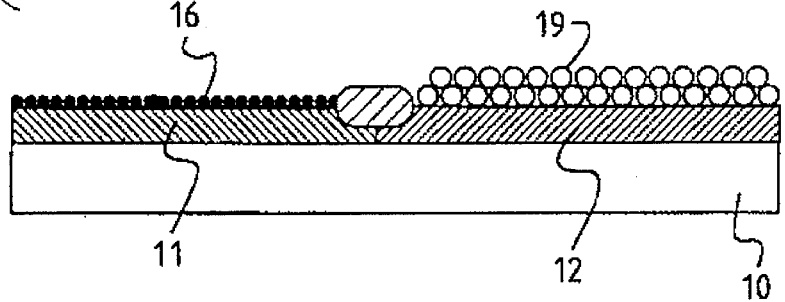

Then, as shown in FIG. 7C, Sb atoms 19 are selectively adsorbed to the Si surface by several atom layers. Like that shown in FIG. 1C of Example 1, this processing is applied by introducing Si substrate 10 irradiated with KrF excimer laser beams 17 from pattern forming chamber 82 by way of transfer chamber 81 as it is with no exposure to atmosphere into doping chamber 83 in ultra-high vacuum, and adsorbing Sb atoms 19 by a required amount from a Knudsen cell while controlling the evaporation by the on-off of a shutter. For the sake of easy understanding, Sb atoms (or $Sb_4$ molecules) 19 are represented by blank circles as two atoms layers in the drawings. Further, the substrate temperature is set to not more than 500° C. at which hydrogen atoms 16 are not desorbed. Since adsorption of Sb is also observed to some extent on hydrogen terminated Si at a room temperature, the substrate temperature is set at 350° C. by which the amount can be reduced to not more than 1/500 to the amount adsorbed on the cleaned Si surface. Accordingly, the substrate temperature is preferable within a range from 350° to 500° C.

Figure 8A:
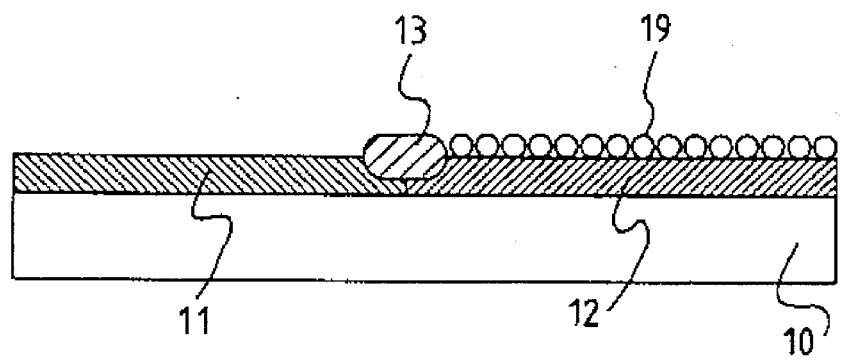
FIGS. 8A to 8D are cross sectional structural views schematically illustrating sequentially processing steps subsequent to FIG. 7C.

Successively, as shown in FIG. 8A, the substrate temperature is raised to 600° to 700° C. to remain only one atom layer of Sb 19 bonded to the Si surface on n-well layer 12. In this step, since the hydrogen atom mask is also removed by desorption simultaneously, Si is exposed on p-well layer 11.

Figure 8B:
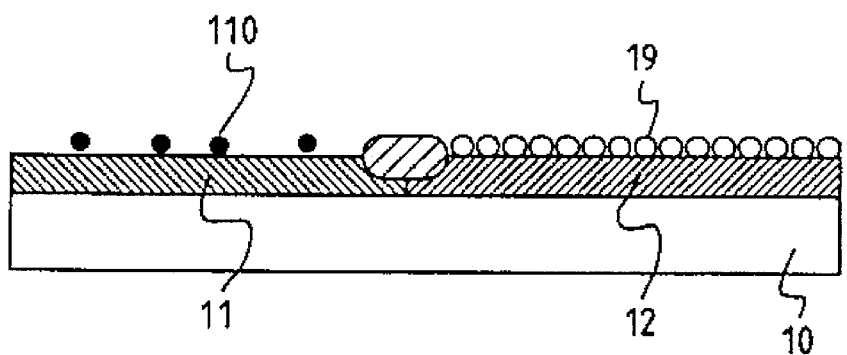

Then, as shown in FIG. 8B, $HBO_2$ molecules 110 are adsorbed by $1\times10^{13}/cm^2$ from a Knudsen cell while controlling the evaporation amount by the on-off of a shutter. For the easy understanding, $HBO_2$ molecules (or decomposition product thereof) 110 are represented by solid circles slightly greater than hydrogen atoms 16 in the drawing. $HBO_2$ molecules 110 are adsorbed selectively only to a region with no Sb 19, that is, only on p-well layer 11 with exposed Si at a substrate temperature of 600° C. Accordingly, a pattern layer of $HBO_2$ molecules can be formed in a self-aligned fashion relative to the patterned layer of the Sb atoms.

Figure 8C:
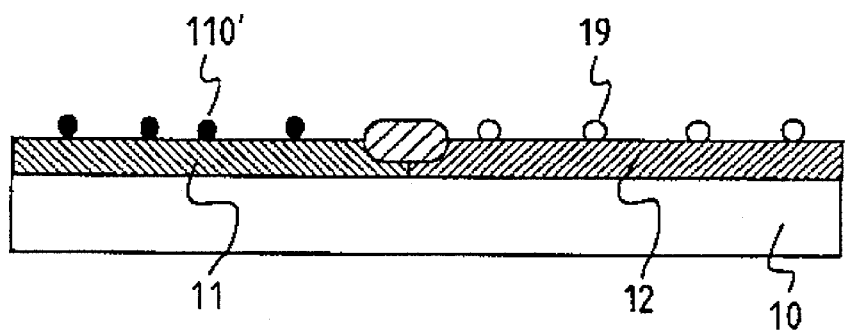

Then as shown in FIG. 8C, Sb atoms are thermally desorbed at a substrate temperature of 750° C. leaving by the amount of $1\times10^{13}/cm^2$. In this step, $HBO_2$ molecules 110 are decomposed and only B atoms 110' remain at or near the Si surface.

Figure 8D:
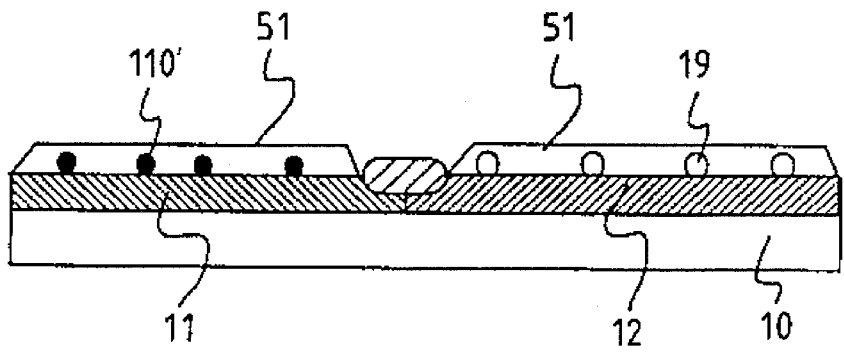

Finally, as shown in FIG. 8D, selective Si epitaxy is applied at a substrate temperature of about 600° C. on Sb atoms 19 and B atoms 110' as adsorbed impurities by using an UHV-CVD process to grow single crystal Si film 51 by about 50 nm, thereby enabling to form a punch-through stopper. Since this may be used as a substrate for forming the MOSFET and a source/drain junction can be formed by adopting a method of impurity doping in Example 1 described previously, explanation therefor is omitted.

A high speed circuit operation of 10 ps gate delay time can be attained in CMOS with a gate length of 0.05 μm by the method described above. Although descriptions have been made in this embodiment to a case of using Sb atoms and $HBO_2$ molecules as the impurity source, As atoms, P atoms or gaseous molecules of $SbH_3$, $AsH_3$, $PH_3$, $B_2O_3$ and $B_2H_6$ may also be used.

EXAMPLE 4

Descriptions will be made to a fourth embodiment for a method of impurity doping into the semiconductor according to the present invention with reference to FIG. 9A to FIG. 11B. FIGS. 9A to 11B are cross sectional structural views schematically illustrating principal processing steps sequentially for a method of impurity doping in a case of applying the invention to the formation of a well layer for Si-CMOS. Descriptions will be made in the order of steps. Cluster chamber 80 shown in FIG. 15 is used as an apparatus for doping impurity.

Figure 9A:
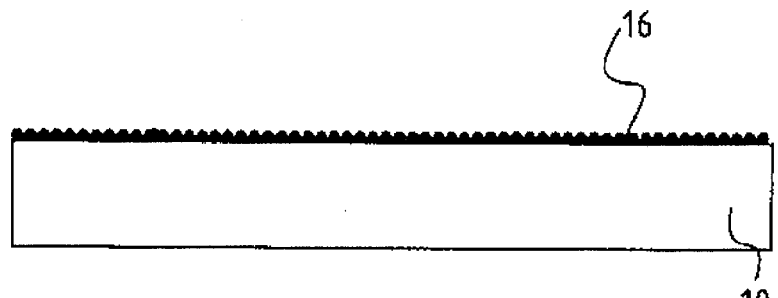
FIGS. 9A to 9C are cross sectional structural views schematically illustrating sequentially principal processing steps in a fourth embodiment of a method of impurity doping into a semiconductor according to the present invention.

At first, in FIG. 9A, after chemically cleaning Si substrate 10 using, for example, a mixed solution of aqueous ammonia and hydrogen peroxide, spontaneous films are removed in a hydrofluoric acid solution to terminate the surface of Si substrate 10 with hydrogen atoms 16.

Figure 9B:
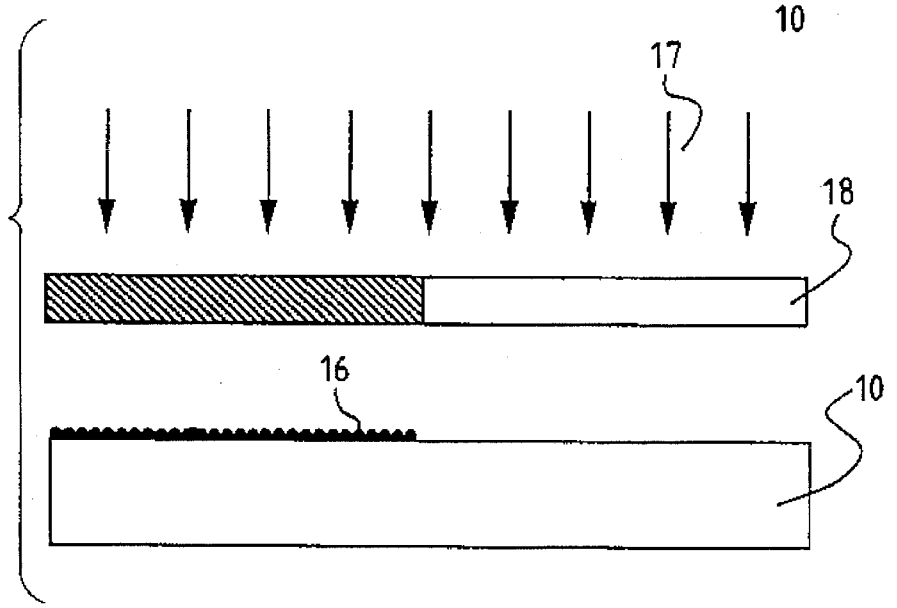

The substrate is introduced from specimen load-lock chamber 85 of cluster chamber 80 by way of transfer chamber 81 into pattern forming chamber 82, and KrF excimer laser beams are irradiated, as shown in FIG. 9B, through quartz reticle 18. In this step, hydrogen atoms 16 are desorbed from a portion irradiated with KrF excimer laser beams 17 that transmit through a transparent portion of reticle 18, whereas hydrogen atoms 16 remain on the surface opposing the light-shield portion of reticle 18 depicted by hatched lines, since KrF excimer laser beams 17 are not irradiated.

Figure 9C:
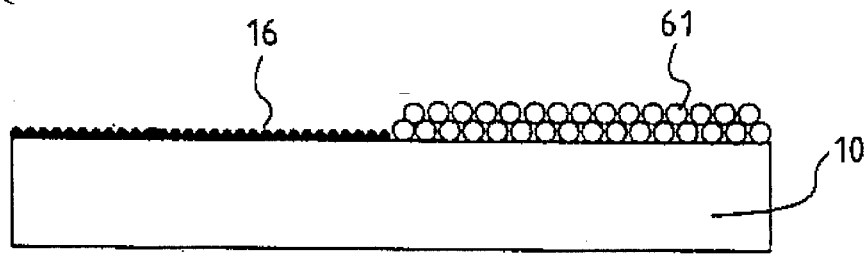

Then, Si substrate 10 is introduced by way of a transfer chamber 81 as it is, without exposing to atmosphere, into doping chamber 83 in an ultra-high vacuum and then a $PH_3$ gas is supplied to selectively adsorb $PH_3$ molecules 61 by several molecule layers to the Si surface as shown in FIG. 9C. Required amount of adsorption can be obtained by controlling the on-off of a gas supply nozzle. For the sake of easy understanding, $pH_3$ molecules (or decomposition products thereof) 61 are represented by blank circles as two atom layers in the drawing. Further, the substrate temperature is set to not more than 500° C., preferably, within a range of 350° to 500° C. at which hydrogen atoms 16 do not desorb.

Figure 10A:
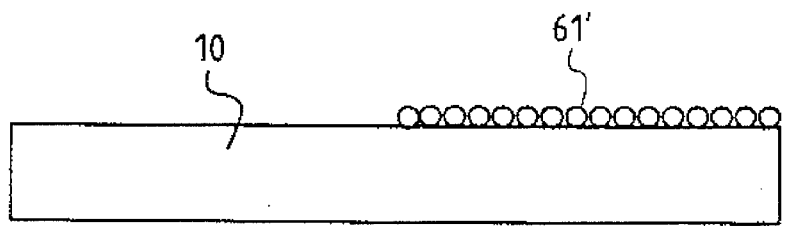
FIGS. 10A to 10C are cross sectional structural views schematically illustrating processing steps subsequent to FIG. 9C sequentially.

Successively, the substrate temperature is raised to 600°–700° C. and, as shown in FIG. 10A, $pH_3$ molecules are decomposed and hydrogen atoms 16 are removed by desorption leaving only P atoms 61' for single atom layer bonded to Si at the surface.

Figure 10B:
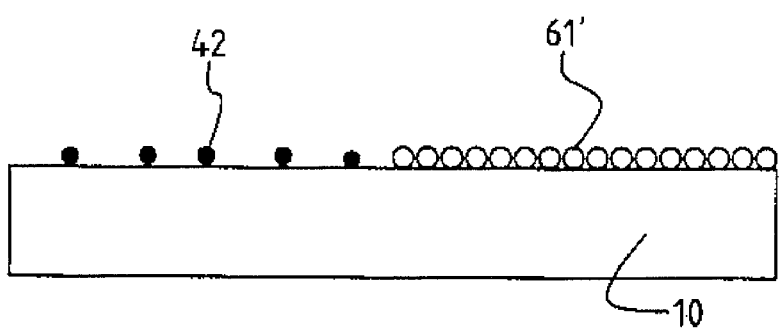

Then, a $B_2H_6$ gas is supplied to adsorb $B_2H_6$ molecules by $1\times10^{13}/cm^2$. For the sake of easy understanding, $B_2H_6$ molecules (or decomposition products thereof) 42 are represented by solid circles slightly greater than hydrogen atoms 16. Required amount of adsorption can be obtained by controlling the on-off of a gas supply nozzle. $B_2H_6$ molecules 42 are adsorbed selectively only to a region with no P atoms 61' at a substrate temperature of 600° C. as shown in FIG. 10B. That is, a patterned layer of the $B_2H_6$ molecules can be formed in a self-aligned fashion relative to the patterned layer of P atoms.

Figure 10C:
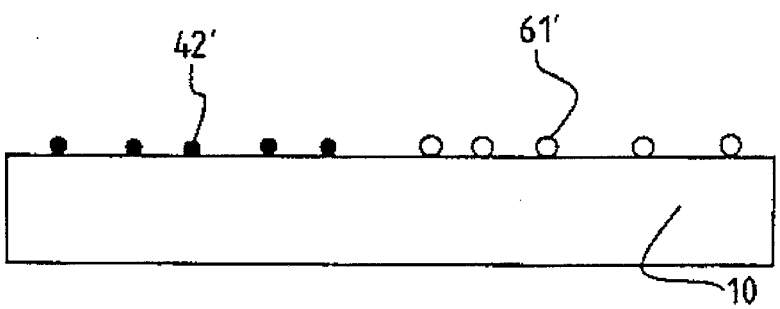

Then, as shown in FIG. 10C, P atoms 61' are thermally desorbed at a substrate temperature of 700° C. leaving P atoms 61' only by $1\times10^{13}/cm^2$. In this step, $B_2H_6$ molecules 42 are decomposed to remain only B atoms 42' near and at that Si surface.

Figure 11A:
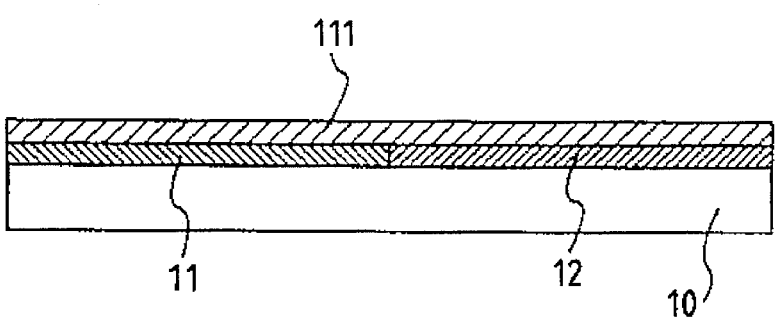
FIGS. 11A and 11B are cross sectional structural views schematically illustrating processing steps subsequent to FIG. 10C sequentially.

Further, Si substrate 10 is introduced from doping chamber 83 by way of transfer chamber 81 into CVD chamber 84 and, as shown in FIG. 11A, CVD oxide film 111 is deposited at a substrate temperature not more than 600° C., drive-in diffusion is applied in nitrogen under condition, for example, at 1100° C. for 1200 min, to form p-well layer 11 for n-channel FET and n-well layer 12 for p-channel FET.

Figure 11B:
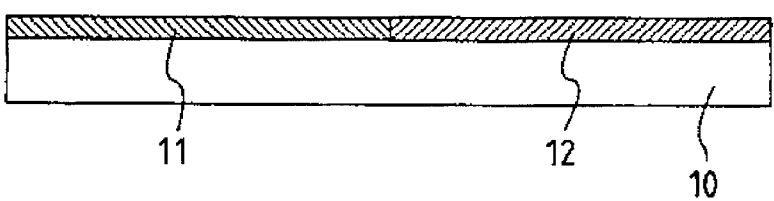

Finally, when CVD oxide film 111 is removed by an aqueous solution of hydrofluoric acid, Si substrate 10 having p-well layer 11 and n-well layer 12 as shown in FIG. 11B can be obtained.

Since doping for forming CMOS well can be applied in an all dry process to a required region without using photoresist, a number of cleaning steps are no more necessary and the number of well forming steps which are required by so much as 16 steps in a case of using the existent ion implantation can be decreased to 7 steps including the pre-cleaning step.

EXAMPLE 5

Descriptions will be made more in details to a fifth embodiment for a method of impurity doping into the semiconductor according to the present invention with reference to FIG. 12A to FIG. 14C. FIGS. 12A to 14C are cross sectional structural views schematically showing principal processing steps sequentially in a case of applying the invention to doping of a polycrystal Si gate electrode for use in Si-CMOS. Descriptions will be made in the order of steps. Cluster chamber 80 shown in FIG. 15 is used as an apparatus for doping impurities.

Figure 12A:
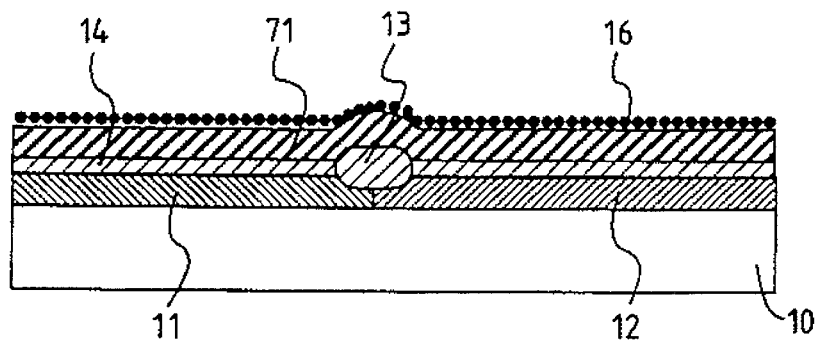
FIGS. 12A and 12B are cross sectional structural views schematically illustrating sequentially principal processing steps in a fifth embodiment of a method of impurity doping into a semiconductor according to the present invention.

A cross sectional structure shown in FIG. 12A is obtained as described below. At first, after previously forming p-well layer 11 and n-well layer 12 on Si substrate 10, isolation oxide 13 is formed by LOCOS oxidation. It will be apparent that both of well layers 11 and 12 can be formed by a method as explained for Example 4. Then, after forming gate oxide layer 14, undoped polycrystal Si film 71 is entirely deposited by a CVD process. Further, spontaneous oxide films are removed in an aqueous solution of hydrofluoric acid to terminate the Si surface with hydrogen atoms 16.

Figure 12B:
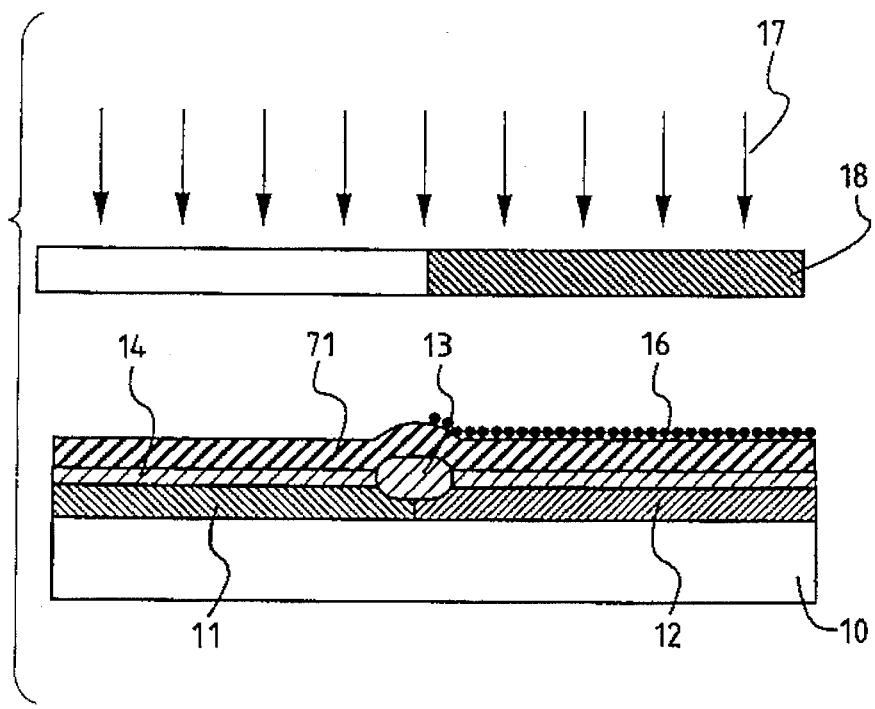

Then, Si substrate 10 is introduced from specimen load-lock chamber 85 of cluster chamber 80 into pattern forming chamber 82 by way of transfer chamber 81 and, as shown in FIG. 12B, KrF excimer laser beams 17 are irradiated to the surface of Si substrate 10. In this step, hydrogen atoms 16 are removed by desorption from a portion irradiated with KrF excimer laser beams 17 that transmit through a transparent portion of reticle 18 but hydrogen atoms 16 remain on the surface opposing the light-shield portion of reticle 18 depicted by hatched lines since KrF excimer laser beams 17 are not irradiated there.

Figure 13A:
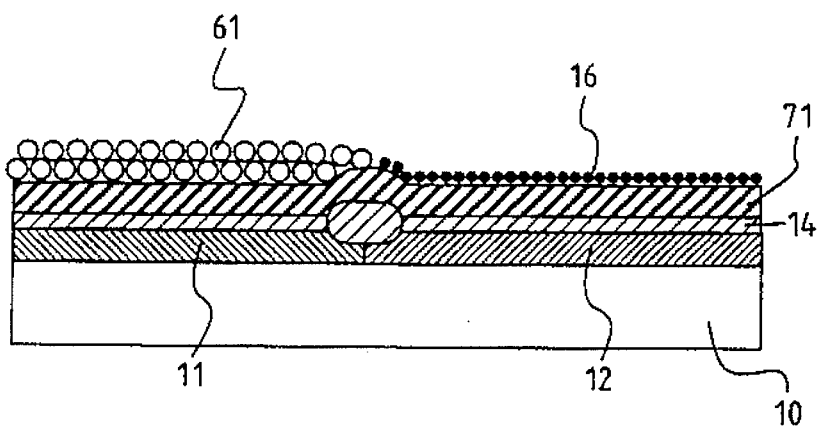
FIGS. 13A and 13B are cross sectional structural views schematically illustrating processing steps subsequent to FIG. 12B sequentially.

Then, after introducing Si substrate 10 by way of transfer chamber 81 as it is, without exposing to atmosphere, into doping chamber 83 in an ultra-high vacuum, a $PH_3$ gas is supplied and $PH_3$ molecules 61 are selectively adsorbed by several molecule layers to the Si surface as shown in FIG. 13A. Required amount of adsorption can be obtained by controlling the on-off of a gas supply nozzle. For the sake of easy understanding, $PH_3$ molecules (or decomposition products thereof) 61 are represented by blank circles as two atom layers in the drawing. Further, the substrate temperature is set to not more than 500° C., preferably, within a range from 350° to 500° C. at which hydrogen atoms 16 are not desorbed.

Figure 13B:
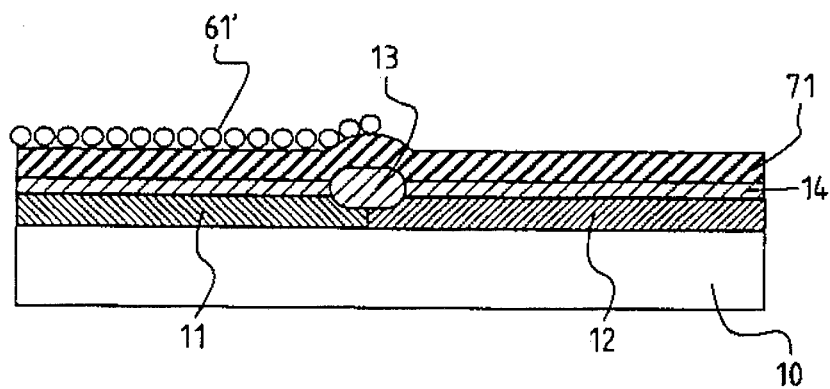

Successively, the substrate temperature is raised to 600°–700° C. and, as shown in FIG. 13B, $PH_3$ molecules 61 are decomposed and hydrogen atoms 16 are removed by desorption leaving only a single atom layer of P atoms 61' bonded to Si at the surface.

Figure 14A:
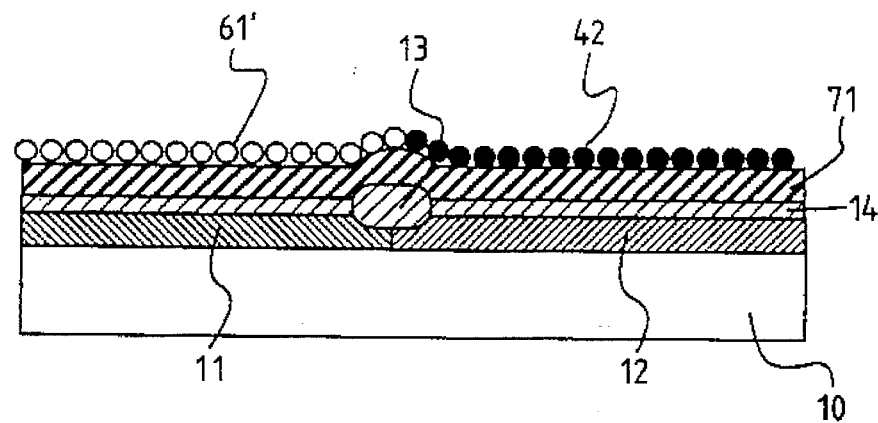
FIGS. 14A to 14C are cross sectional structural views schematically illustrating processing steps subsequent to FIG. 13B sequentially.

Then, $B_2H_6$ molecules 42 are adsorbed by a single atom layer as shown in FIG. 14A by controlling the on-off of a gas supply nozzle. For the sake of easy understanding, $B_2H_6$ molecules (or decomposition products thereof) 42 are represented by solid circles slightly greater than hydrogen atoms 16 in the drawing. $B_2H_6$ molecules 42 are selectively adsorbed only to a region with no P atoms 61' at a substrate temperature of 600° C. That is, a patterned layer of the $B_2H_6$ molecule can be formed in a self-aligned fashion relative to patterned layer of P atoms.

Figure 14B:
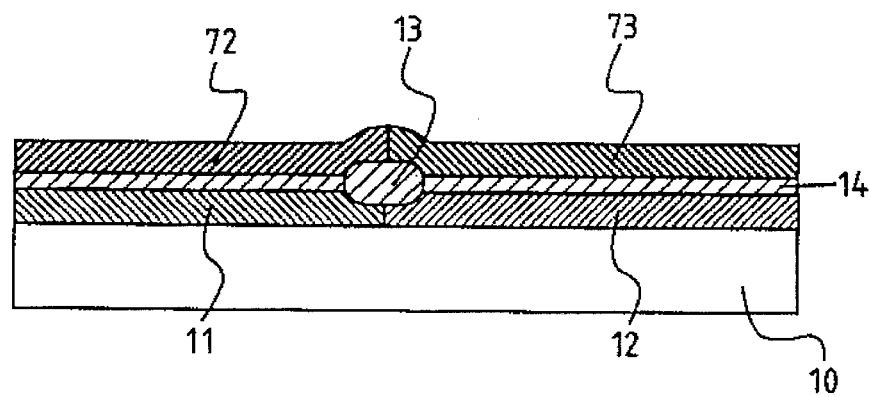

Successively, Si substrate 10 is introduced by way of transfer chamber 81 as it is, without exposing to atmosphere, into CVD chamber 84, an undoped polycrystal Si film is again deposited to about 100 nm at a substrate temperature not exceeding 600° C., and drive-in diffusion is applied in nitrogen, for example, at 800° C. for about 10 min, to form P-doped polycrystal Si film 72 and B-doped polycrystal Si film 73 as shown in FIG. 14B.

Figure 14C:
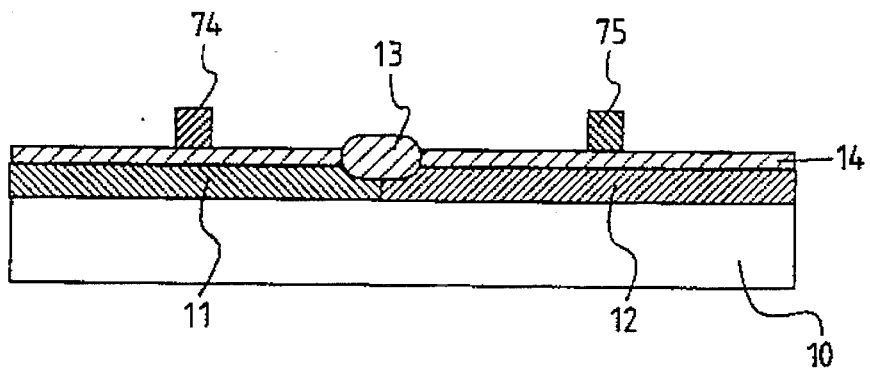

Finally, refined processing is applied by usual photo- and dry-etching process to form $n^+$ polycrystal Si gate electrode 74 for an n-channel FET and $p^+$ polycrystal Si gate electrode 75 for a p-channel FET as shown in FIG. 14C.

According to the method described above, two kinds of doping for the $n^+$ polycrystal Si gate electrode and the $p^+$ polycrystal Si gate electrode can be formed by the photo-etching process only for once. Further, when the conduction type for the polycrystal Si gate electrode is changed in this way, a p-MOSFET which was formed so far as an embedded channel type is obtainable also as a surface channel type like that an n-MOSFET, which is effective to suppress the short channel effect of CMOS with a gate length of less than 0.2 μm.

For attaining further reduction of the resistance for polycrystal Si gate electrodes 74, 75, it is effective to employ a method of using polycrystal Si the grain size of which is increased by deposition and heat treatment of amorphous Si or a method of repeating impurity doping steps for several times. In the latter, since the hydrogen atom mask is used for several times, if a radical cell for forming hydrogen atoms 16 by electric discharge is added to pattern forming chamber 82 of cluster chamber 80 shown in FIG. 15, an in-situ processing not exposing specimens to atmosphere is possible.

EXAMPLE 6

Descriptions will be made to a sixth embodiment for the method of introducing doping impurity into the semiconductor device according to the present invention with reference to FIGS. 17A to 17D. FIGS. 17A to 17D are cross sectional structural views schematically illustrating principal processing steps successively for one embodiment in a case of applying doping impurity at multi-level concentrations by selective adsorption of impurity atoms utilizing a hydrogen mask at the silicon surface. Descriptions will be made in the order of steps. Cluster chamber 80 shown in FIG. 15 is used as an apparatus for doping impurities.

Figure 17A:
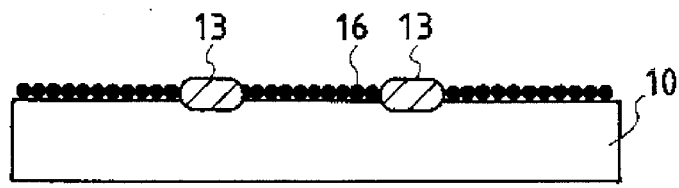
FIGS. 17A to 17D are cross sectional structural views schematically illustrating successively principal processing steps in a sixth embodiment of a method of impurity doping into a semiconductor according to the present invention.

FIG. 17A shows a state in which the surface of Si substrate 10 is terminated with hydrogen atoms 16. The silicon surface is terminated with hydrogen atoms 16 by applying hydrofluoric acid cleaning to Si substrate 10 already formed with isolation oxide 13 by LOCOS oxidation.

Figure 17B:
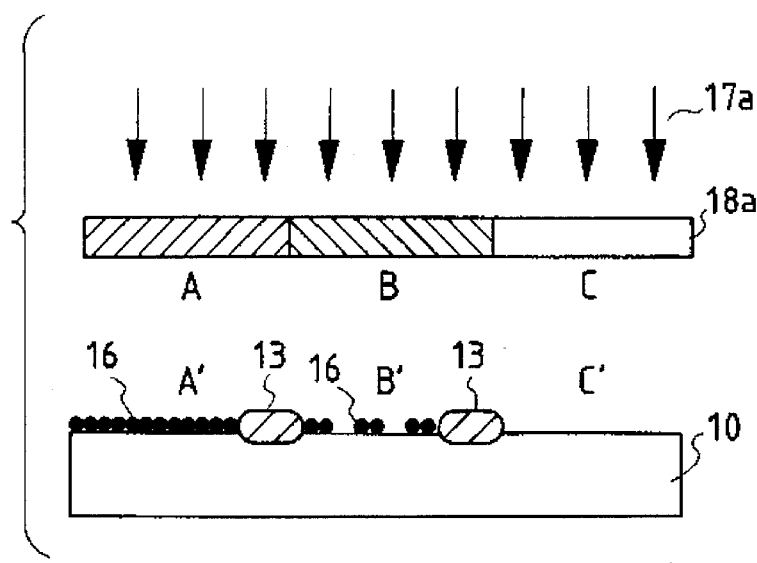

Then, Si substrate 10 is introduced from specimen loadlock chamber 85 of cluster chamber 80 by way of transfer chamber 81 into pattern forming chamber 82 and, as shown in FIG. 17B, UV-rays 17a are irradiated to Si substrate 10 through reticle 18a having different transmission coefficients within a plane. Reticle 18 used for in this embodiment is prepared by vapor depositing chromium on a glass substrate to provide, for example, region A at 0% transmission, region B at 50% transmittance and region C at 100% transmission, within a plane respectively. UV-rays 17a are irradiated through reticle 18a in an ultra-high vacuum or ultra-pure nitrogen ($N_2$) so as not to oxidize the silicon surface. Under the irradiation of UV-rays 17a, hydrogen atoms 16 terminating the silicon surface remain by 100% at portion A' corresponding to region A of the 0% transmission coefficient, and remain by 50% and 0% respectively at portion B' corresponding to region B of 50% transmission coefficient and at portion C' corresponding to region C of 100% transmission coefficient.

Figure 17C:
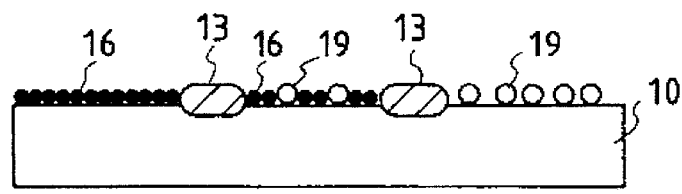

FIG. 17C is a view illustrating a state of selectively adsorbing Sb atoms 19 on Si substrate 10 after applying the processings described above. For the sake of easy understanding, Sb atoms 19 are represented by blank circles in the drawing. Si substrate 10 after irradiation with UV-rays 17a is introduced by way of transfer chamber 81 as it is with no exposure to atmosphere into doping chamber 83 in an ultra-high vacuum. Subsequently, Sb atoms 19 are adsorbed by $2 \times 10^{12}/cm^2$ to the surface of Si substrate 10 from a Knudsen cell while controlling the evaporation amount by the on-off of a shutter. Thus, Sb atoms 19 are not adsorbed at all at region A' terminated by 100% with hydrogen, whereas they are adsorbed by $1 \times 10^{12}/cm^2$ and $2 \times 10^{12}/cm^2$, at region B' and C' respectively.

Figure 17D:
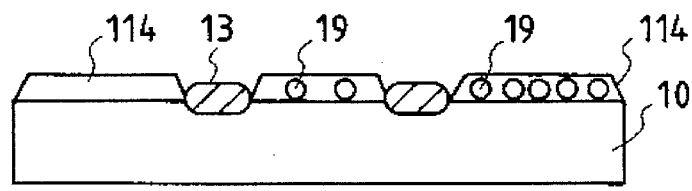

FIG. 17D is a view illustrating a state of forming single crystal Si film 114 on Si substrate 10. After the adsorbing processing for the Sb atoms, Si substrate 10 is introduced by way of transfer chamber 81 as it is, without exposing to atmosphere, into CVD chamber 84 in an ultra-high vacuum. Since Sb atoms 19 are liable to desorb from the surface of the silicon substrate by heating, single crystal Si film 114 is caused to grown by selective epitaxy as a cap layer for inhibiting the desorption. Sb is doped into the silicon substrate using, as an impurity source, Sb atoms 19 covered with single crystal Si film 114 grown by selective epitaxy.

By a series of processings as described above, n-type doping at three levels of impurity concentrations (including an impurity concentration at zero as one of the levels) can be attained by a transfer process by UV-irradiation for once. Since channel doping for controlling multi-level of threshold voltages can be conducted by a pattern projection process for once, it contributes to the reduction for the number of steps. Further, instead of Sb atoms 19, As atoms, P atoms or gaseous molecules of $PH_3$, $AsH_3$ and $SbH_3$ may also be used. Further, instead of single crystal Si film 114, an oxide film formed by low temperature deposition may be used as a cap layer and impurity atoms may be thermally diffused into Si substrate 10. For the method of attaining the multi-level doping by the pattern projection process for once, it is of course possible to employ methods other than the method of using the reticle having different transmission coefficients within a plane and a hydrogen terminating mask as in this embodiment. For instance, there are a method of using a reticle having different transmission coefficients within a plane and a multi-layered resist having different photosensitive characteristics and a method of using a reticle having different transmission coefficients within a plane and an ultra-thin oxide film.

Although descriptions have been made to several preferred embodiments of the present invention, the invention is not restricted only to the embodiments described above but various design changes are possible within a scope not departing the spirit of the present invention.

As apparent from the preferred embodiments described specifically, above according to the present invention, since a hydrogen mask terminating the Si surface with hydrogen is used as a selective adsorption mask for impurity doping, a junction as shallow as 10–20 nm having a controllability at an atom layer level and at a high impurity concentration can be formed with a less number of steps than the existent ion implantation or solid phase diffusion.

Further, when the hydrogen mask is used as the selective adsorption mask for impurity doping and, further, using Sb atom or P atom layers as the selective adsorption mask for the p-type impurity atom layer, n-type and p-type doping having a controllability at the atom layer level can be attained with less number of steps selectively and in a self-aligned fashion. This particularly provides a remarkable advantageous effect for reducing the number of steps when it is used for doping of well layers, punch-through stoppers, source/drain junctions and polycrystal silicon gate electrodes in a CMOS process having a number of portions to be doped with n-type and p-type impurities in a self-aligned fashion.

Further, since a miniaturized CMOS transistor having a source/drain junction with a junction depth of less than 20 nm and a sheet resistance of less than $5K\Omega/\square$ can be obtained by a lesser number of steps by the method of doping impurities into the semiconductor according to the present invention, a microprocessor or the like which is inexpensive, and operates at a high speed with high performance can be attained by constituting a semiconductor integrated circuit by using the thus formed CMOS transistor.

Further, by the method of introducing impurity into the semiconductor according to the present invention using the reticle having different transmission coefficients within a plane and the hydrogen mask, impurity doping at multi-level concentrations can be conducted by a pattern projection process for once.

Furthermore, an apparatus for introducing impurity into the semiconductor according to the present invention can provide an advantageous effect capable of conducting impurity doping which is controllable at an atom layer level by using the hydrogen mask in an in-situ vacuum processing without exposing specimens to atmosphere, by constituting a cluster chamber with a doping chamber, a pattern forming chamber, a CVD chamber and a specimen load-lock chamber each of which is connected and disposed by way of a gate valve around a transfer chamber as a center.

What is claimed is:

1. A method of impurity doping into a silicon semiconductor, which comprises irradiating energy rays to a region of a hydrogen terminated silicon surface to remove hydrogen atom layers terminating the silicon surface thereby forming a patterned first silicon surface region not terminated with hydrogen, forming an oxide film on the patterned first silicon surface region by exposure to an oxidizing atmosphere, then removing residual hydrogen atom layers to form a second silicon surface region and selectively adsorbing impurities to the second silicon surface region using said oxide film as a mask, thereby applying impurity doping to the second silicon surface region.

2. The method of impurity doping into a silicon semiconductor as defined in claim 1, wherein impurity doping is applied by selectively adsorbing the impurity and then covering the surface with a silicon film or an oxide film in an identical processing apparatus.

3. The method of impurity doping into a silicon semiconductor as defined in claim 1, wherein the impurity adsorbed selectively is selected from the group consisting of Sb, As, P, $SbH_3$, $AsH_3$, $PH_3$, $HBO_2$, $B_2O_3$ and $B_2H_6$.

4. A method of impurity doping into a silicon semiconductor, which comprises irradiating energy rays to a region of a hydrogen terminated silicon surface to remove hydrogen atom layers terminating the silicon surface thereby forming a patterned first silicon surface region not terminated with hydrogen, selectively adsorbing impurities of a first conduction type to the patterned first silicon surface region to form an impurity adsorption layer of the first conduction type, then removing residual hydrogen atom layers to form a second silicon surface region, and selectively adsorbing impurities of a second conduction type to the second silicon surface region using said impurity adsorption layer of the first conduction type as a mask, thereby conducting impurity doping of first and second conduction types in a self-aligned fashion.

5. A method of impurity doping into a silicon semiconductor, which comprises irradiating energy rays to a region of a silicon surface covered with impurity atoms of a first conduction type, said impurity atoms of the first conduction type not being hydrogen, to remove the impurity atoms of the first conduction type thereby forming a silicon surface region exposed in a patterned configuration, and selectively adsorbing impurities of a second conduction type to the silicon surface region using the region covered with the impurity atoms of the first conduction type as a mask, thereby conducting impurity doping of the first and the second conduction types in a self-aligned fashion.

6. The method of impurity doping into a silicon semiconductor as defined in claim 4, wherein impurity doping is applied by selectively adsorbing the impurities of the second conduction type and then covering the surface with a silicon film or an oxide film within an identical processing apparatus.

7. The method of impurity doping into a silicon semiconductor as defined in claim 4, wherein the impurities of the first conduction type are selected from the group consisting of Sb, As, P, $SbH_3$, $AsH_3$ and $PH_3$, and the impurities of the second conduction type are selected from the group consisting of $HBO_2$, $B_2O_3$, and $B_2H_6$.

8. A method of impurity doping into a silicon semiconductor, which comprises terminating a silicon surface with hydrogen atoms, placing the same in an ultra-high vacuum or inert gas atmosphere, irradiating UV-rays to the silicon surface by way of a reticle having at least three regions with different UV-ray transmission coefficients, thereby desorbing the hydrogen atoms in at least three silicon surface regions corresponding respectively to the at least three different UV-ray transmission coefficients, and adsorbing impurities by the at least three silicon surface regions using the resultant residual hydrogen as a selection mask for impurity atoms or molecules containing the impurity atoms, thereby applying impurity doping at a different concentration level for each of the at least three silicon surface regions.

9. The method of impurity doping into a silicon semiconductor as defined in claim 1, wherein said energy rays are selected from the group consisting of excimer laser beams, UV-rays and electron beams.

10. The method of impurity doping into a silicon semiconductor as defined in claim 1, wherein, during said selectively adsorbing impurities, a silicon substrate, providing the silicon surface, is at a temperature in a range of 350°–500° C.

11. The method of impurity doping into a silicon semiconductor as defined in claim 4, wherein said removing the residual hydrogen atom layers is performed at a substrate temperature of 600°–700° C.

12. The method of impurity doping into a silicon semiconductor as defined in claim 4, wherein said silicon surface is a surface of a polycrystalline silicon film.

13. The method of impurity doping into a silicon semiconductor as defined in claim 1, wherein said first conduction type is n-type, the impurity adsorption layer of the first conduction type being an n-type impurity adsorption layer, and the second conduction type is p-type, to thereby conduct n-type and p-type impurity doping in a self-aligned fashion.

14. The method of impurity doping into a silicon semiconductor as defined in claim 13, wherein the n-type impurities contain antimony.

15. The method of impurity doping into a silicon semiconductor as defined in claim 13, wherein the n-type impurities are selected from the group consisting of Sb and $SbH_3$.

16. The method of impurity doping into a silicon semiconductor as defined in claim 1, wherein the impurities adsorbed selectively contain antimony.

17. The method of impurity doping into a silicon semiconductor as defined in claim 1, wherein the impurities adsorbed selectively are selected from the group consisting of Sb and $SbH_3$.

* * * * *